United States Patent
Yu et al.

(10) Patent No.: US 12,396,182 B2
(45) Date of Patent: Aug. 19, 2025

(54) CAPACITOR AND MANUFACTURING METHOD THEREOF, AND SEMICONDUCTOR DEVICE

(71) Applicants: CHANGXIN MEMORY TECHNOLOGIES, INC., Hefei (CN); BEIJING SUPERSTRING ACADEMY OF MEMORY TECHNOLOGY, Beijing (CN)

(72) Inventors: Mengkang Yu, Hefei (CN); Xingsong Su, Hefei (CN); Weiping Bai, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 424 days.

(21) Appl. No.: 18/054,980

(22) Filed: Nov. 14, 2022

(65) Prior Publication Data
US 2023/0170382 A1    Jun. 1, 2023

(30) Foreign Application Priority Data
Nov. 30, 2021 (CN) .......................... 202111473510.7

(51) Int. Cl.
*H10D 1/68* (2025.01)
*H10D 1/00* (2025.01)

(52) U.S. Cl.
CPC ............. *H10D 1/042* (2025.01); *H10D 1/043* (2025.01); *H10D 1/716* (2025.01)

(58) Field of Classification Search
CPC ........ H10D 1/042; H10D 1/043; H10D 1/716; H10D 1/692; H10D 1/68
See application file for complete search history.

(56) References Cited

U.S. PATENT DOCUMENTS

| | | | |
|---|---|---|---|
| 2002/0072190 A1* | 6/2002 | Lee | H10B 12/31 257/E21.267 |
| 2008/0094776 A1* | 4/2008 | Lee | H10D 1/68 361/301.2 |
| 2014/0312460 A1* | 10/2014 | Lee | H10B 12/0335 257/532 |
| 2017/0084684 A1* | 3/2017 | Basker | H10D 1/043 |
| 2019/0096587 A1* | 3/2019 | Shin | H01G 4/306 |
| 2022/0085149 A1* | 3/2022 | Zhu | H10B 12/02 |
| 2022/0302122 A1* | 9/2022 | Sheng | H10B 12/0335 |
| 2024/0387619 A1* | 11/2024 | Lai | H10D 1/716 |

FOREIGN PATENT DOCUMENTS

CN    112768607 A    5/2021

* cited by examiner

*Primary Examiner* — S M Sohel Imtiaz
(74) *Attorney, Agent, or Firm* — Kilpatrick Townsend & Stockton LLP

(57) ABSTRACT

The present disclosure provides a capacitor and a manufacturing method thereof, and a semiconductor device. The capacitor includes a plurality of bottom electrodes, a top electrode structure, a dielectric layer, and a gap filling layer, where the top electrode structure is formed on one side of each of the plurality of bottom electrodes, one side of the dielectric layer is in contact with the plurality of bottom electrodes and the other side is in contact with the top electrode structure, and the gap filling layer fills remaining gaps between the plurality of bottom electrodes.

6 Claims, 17 Drawing Sheets

CAPACITOR AND MANUFACTURING METHOD THEREOF, AND SEMICONDUCTOR DEVICE

CROSS-REFERENCE TO RELATED APPLICATION

This application claims the priority of Chinese Patent Application No. 202111473510.7, submitted to the Chinese Intellectual Property Office on Nov. 30, 2021, the disclosure of which is incorporated herein in its entirety by reference.

TECHNICAL FIELD

The present disclosure relates to the technical field of semiconductors, and in particular to a capacitor and a manufacturing method thereof, and a semiconductor device.

BACKGROUND

With the continuous development of semiconductor memories, the miniaturization of sizes thereof has become a main research direction. Similarly, a size of a capacitor in the semiconductor memory needs to be reduced accordingly to meet a requirement. Currently, there are generally cylindrical and pillar capacitor structures, but there is a limit of miniaturization in either of the structures due to manufacturing process limitations. If the miniaturization of the capacitor structure exceeds a corresponding limit, the filling of a top electrode plate material may fail while ensuring a sufficiently thick high dielectric layer to avoid large current leakage, resulting in a significant reduction of an effective area of the capacitor.

SUMMARY

An overview of the subject matter detailed in the present disclosure is provided below, which is not intended to limit the protection scope of the claims.

The present disclosure provides a capacitor and a manufacturing method thereof, and a semiconductor device.

A first aspect of the present disclosure provides a capacitor. The capacitor includes: a plurality of bottom electrodes; a top electrode structure formed on one side of each of the plurality of bottom electrodes; a dielectric layer, where one side of the dielectric layer is in contact with the plurality of bottom electrodes and the other side is in contact with the top electrode structure; and a gap filling layer filling remaining gaps between the plurality of bottom electrodes.

A second aspect of the present disclosure provides a method of manufacturing a capacitor. The method of manufacturing a capacitor includes: providing a filling layer; forming a plurality of openings on the filling layer; separately forming a bottom electrode in each of the plurality of openings; forming a dielectric layer on a remaining part of the filling layer and the plurality of bottom electrodes, where one side of the dielectric layer is in contact with the plurality of bottom electrodes; forming a top electrode structure on the dielectric layer, where the other side of the dielectric layer is in contact with the top electrode structure; and forming a gap filling layer by using the final remaining part of the filling layer, to fill remaining gaps between the plurality of bottom electrodes.

A third aspect of the present disclosure provides a semiconductor device. The semiconductor device includes: a base; a plurality of contact pads formed on the base; and the capacitor according to any one of the first aspect, where the plurality of bottom electrodes of the capacitor are separately located on the plurality of contact pads.

Other aspects of the present disclosure are understandable upon reading and understanding of the accompanying drawings and detailed description.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Exemplary embodiments of the present disclosure provide a method of manufacturing a capacitor and a corresponding capacitor, to enable a top electrode structure to be formed on one side of each of a plurality of bottom electrodes, for example, the plurality of bottom electrodes and the top electrode structure are separately provided on two sides of the dielectric layer by using the dielectric layer, provided that a sufficient thickness of the dielectric layer is retained between the plurality of bottom electrodes and the top electrode structure, such that a case in which the filling of a top electrode plate material may fail to be performed is further avoided while ensuring the sufficiently thick dielectric layer to avoid relatively large current leakage. In this case, an effective area of the capacitor is significantly decreased, and a miniaturization limit of a capacitor structure is significantly increased. In this way, the capacitor may be made smaller, and a capacitor size may reach to 10+ nanometers, thereby significantly increasing a density of capacitors per unit volume. This overcomes a miniaturization limit problem existing due to the limitation of an annular or columnar structure of the capacitor caused by a manufacturing process in the related art.

Figure 1:
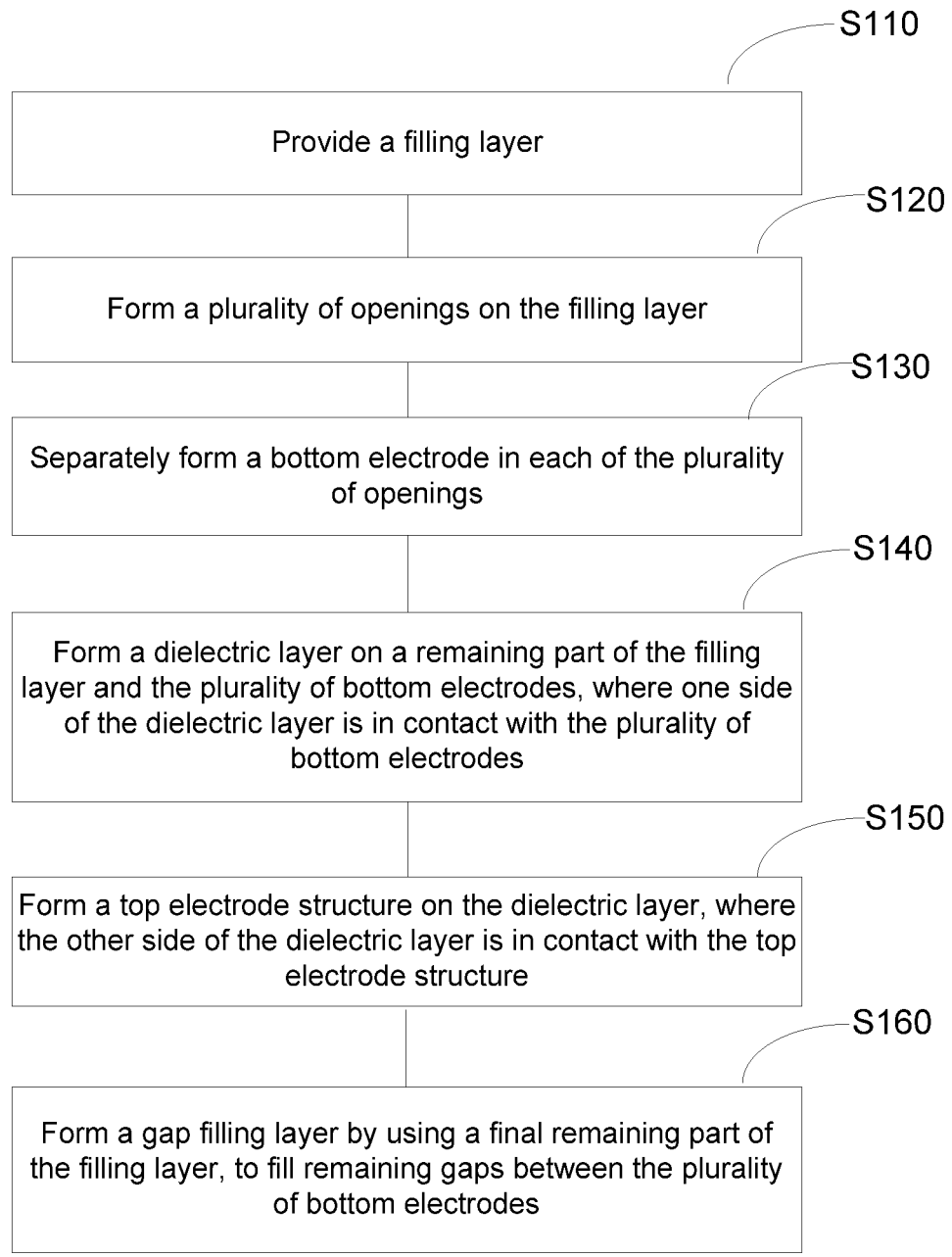
FIG. 1 is a method flowchart of a method of manufacturing a semiconductor structure according to an exemplary embodiment.

An embodiment of the present disclosure provides a method of manufacturing a capacitor 1. FIG. 1 is a schematic flowchart of the method of manufacturing the capacitor 1 according to an exemplary embodiment of the present disclosure. As shown in FIG. 1, the method of manufacturing the capacitor includes the following steps.

Step S110: Provide a filling layer.

Figure 2:
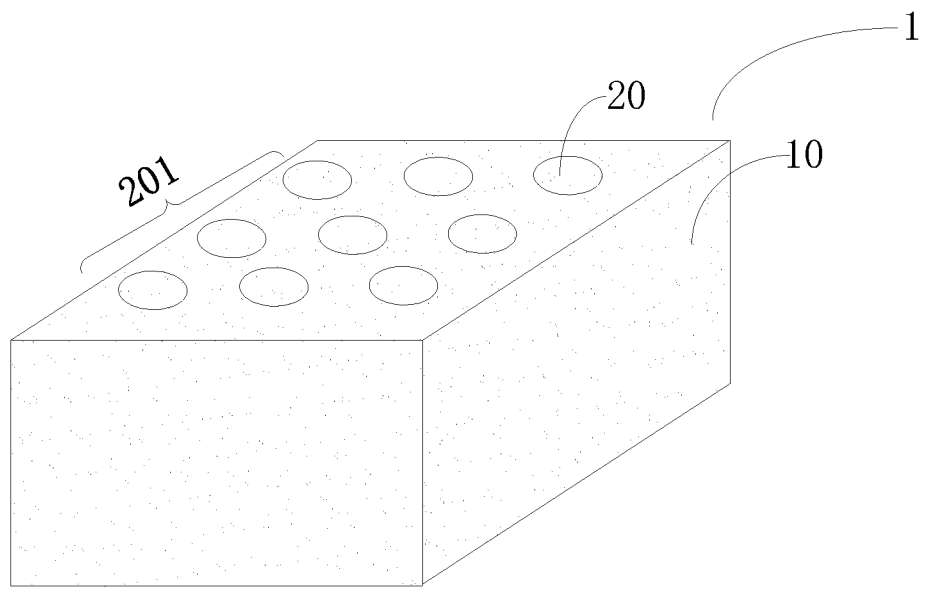
FIG. 2 is a schematic structural diagram of a filling layer according to an exemplary embodiment.

As shown in FIG. 2, FIG. 2 is a schematic diagram of a filling layer 10 provided in a method of manufacturing a capacitor 1 according to an exemplary embodiment of the present disclosure. A material of the filling layer 10 may include oxide, for example, may include but is not limited to, silicon oxide or silicon oxynitride. That the material of the filling layer 10 includes oxide can avoid current leakage and short circuit between a top electrode and a bottom electrode of the capacitor 1.

Step S120: Form a plurality of openings on the filling layer.

Still referring to FIG. 2, an opening 20 is formed in the filling layer 10. There may be a plurality of openings 20. For example, the openings 20 may be circular, rectangular, and other special-shaped openings. The plurality of openings 20 may be arranged in an array. For example, as shown in FIG. 2, some of the plurality of openings 20 are evenly arranged to form an opening group 201 along a first direction, and a plurality of opening groups 201 are parallel to each other along a second direction. The first direction is perpendicular to the second direction. The plurality of openings 20 may be alternatively randomly arranged.

Figure 3:
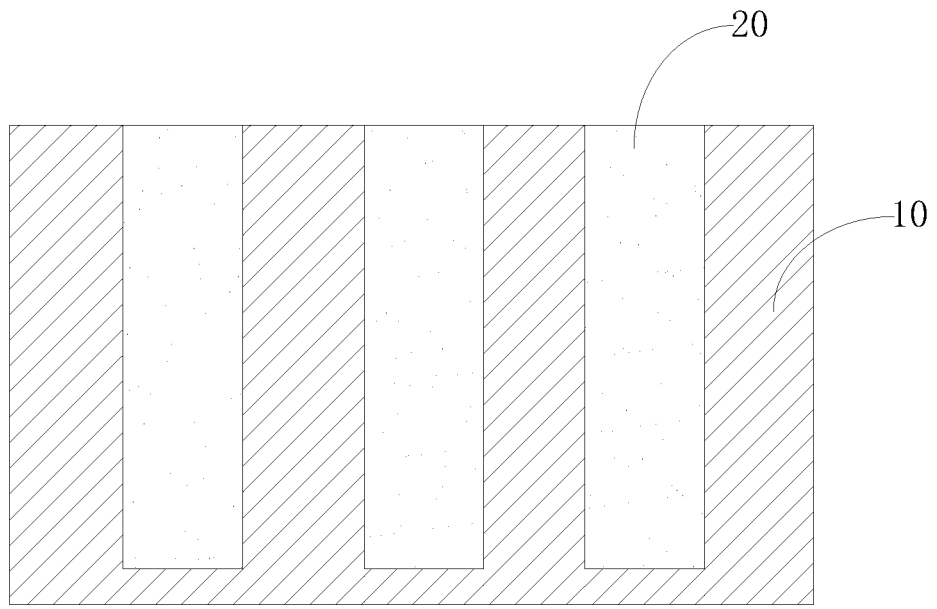
FIG. 3 is a schematic cross-sectional diagram obtained after a plurality of openings are formed on a filling layer according to an exemplary embodiment.

A distance between adjacent openings 20 may be determined according to a need, to satisfy a functional requirement. For example, a distance between adjacent openings 20 is greater than a preset distance. For the opening 20, a depth of the opening 20 may be provided according to a need along a thickness direction of the filling layer 10. As shown in FIG. 3, FIG. 3 is a schematic cross-sectional structural diagram obtained after a plurality of openings are formed on a filling layer 10 in a method of manufacturing a capacitor according to an exemplary embodiment of the present disclosure. In FIG. 3, the opening 20 extends along a thickness of the filling layer.

The manner of forming the opening 20 in the filling layer 10 may be any manner of forming the opening 20 that may be implemented. For example, a patterned first mask layer may be formed on the filling layer 10, where the patterned first mask layer has a plurality of first opening patterns, and etching is performed in the filling layer 10 by using the patterned first mask layer as a mask, until a preset height is reached, to form the plurality of openings 20 in the filling layer 10. In an exemplary embodiment, projection of a sidewall of the opening on the filling layer 10 may be a circular structure. A quantity and diameter sizes of the openings 20 may be specified according to a density of capacitors.

Step S130: Separately form a bottom electrode in each of the plurality of openings.

Figure 4:
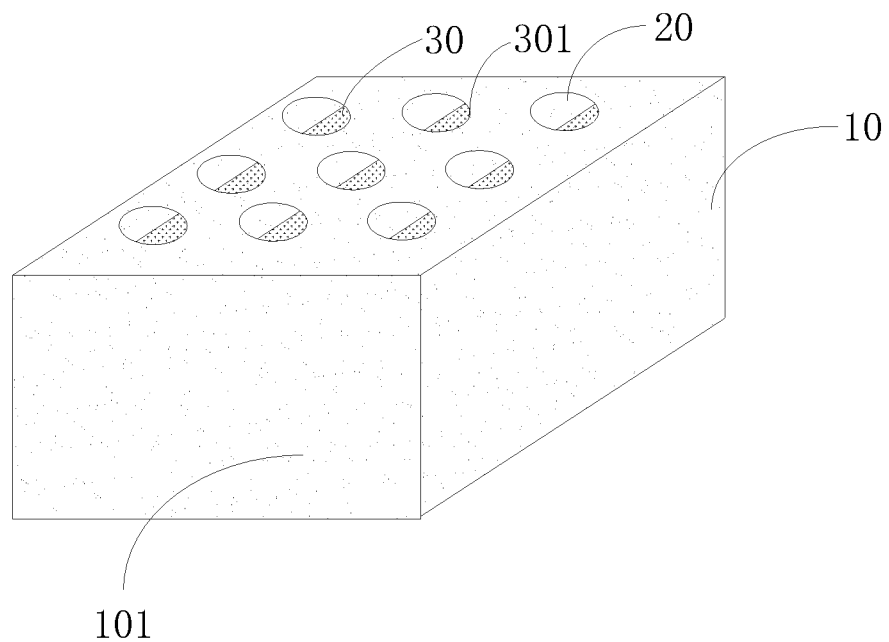
FIG. 4 is a schematic structural diagram obtained after a bottom electrode is formed in each of a plurality of openings according to an exemplary embodiment.
Figure 5:
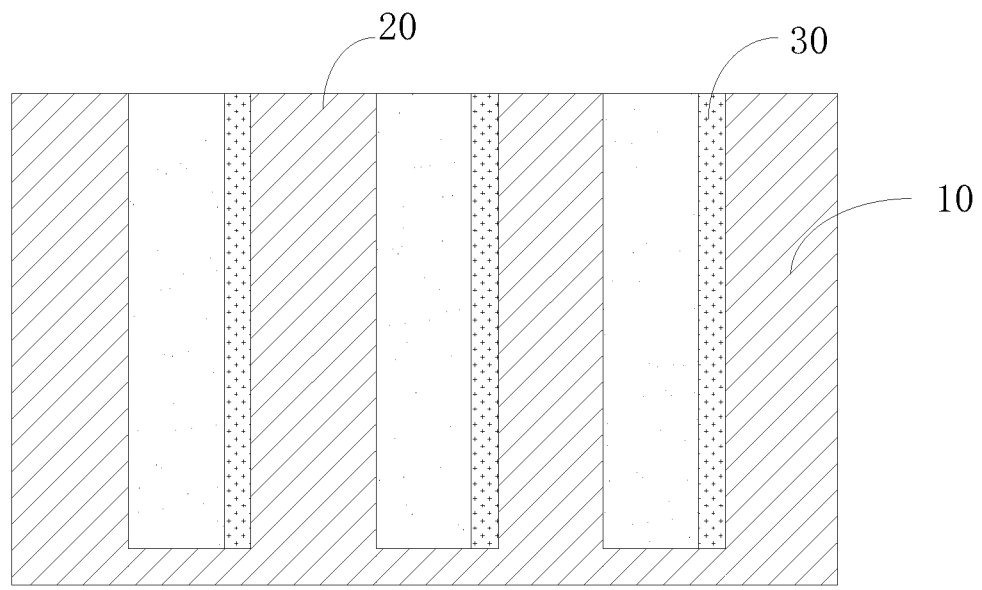
FIG. 5 is a schematic cross-sectional structural diagram obtained after a bottom electrode is formed in each of a plurality of openings according to an exemplary embodiment.

Referring to FIG. 4 and FIG. 5, FIG. 4 is a schematic structural diagram obtained after a bottom electrode 30 is formed in each of a plurality of openings 20 in a method of manufacturing a capacitor according to an exemplary embodiment of the present disclosure. FIG. 5 is a schematic cross-sectional structural diagram obtained after a bottom electrode 30 is formed in each of a plurality of openings 20 in a method of manufacturing a capacitor according to an exemplary embodiment of the present disclosure.

In this exemplary embodiment of the present disclosure, the bottom electrode 30 is separately formed in each of the plurality of openings 20. One bottom electrode 30 is formed in each opening 20, and the bottom electrode 30 covers part of a sidewall of the opening 20. In FIG. 3, projection of the sidewall of the opening 20 on the filling layer 10 is a circle, and the bottom electrode 30 includes a first arc surface 301. The first arc surface 301 covers part of the sidewall of the opening 20.

The bottom electrode 30 may be deposited on part of the sidewall of the opening 20 by using an atomic layer deposition (ALD) process or through chemical vapor deposition (CVD), where the bottom electrode 30 covers part of the sidewall of the opening 20. A material of the bottom electrode 30 may be any electrode material, for example, may include but is not limited to, selected titanium nitride, molybdenum nitride, tungsten nitride, tantalum nitride, aluminum nitride, ruthenium nitride, or an alloy thereof, or selected indium tin oxide, tin oxide, or indium zinc oxide, and selected aluminum, tantalum, chromium, copper, gold, platinum, or ruthenium.

Step S140: Form a dielectric layer on a remaining part of the filling layer and the plurality of bottom electrodes, where one side of the dielectric layer is in contact with the plurality of bottom electrodes.

Figure 6:
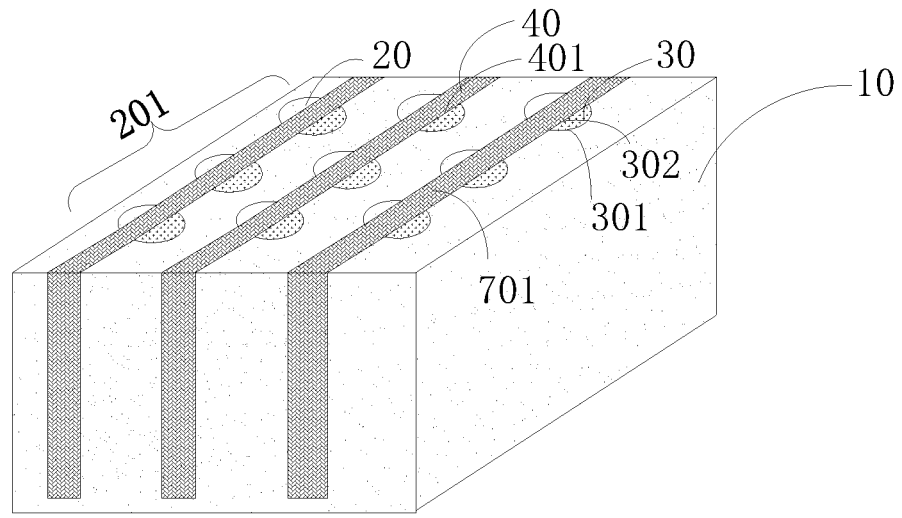
FIG. 6 is a schematic structural diagram obtained after a dielectric layer is formed on a plurality of bottom electrodes according to an exemplary embodiment.
Figure 7:
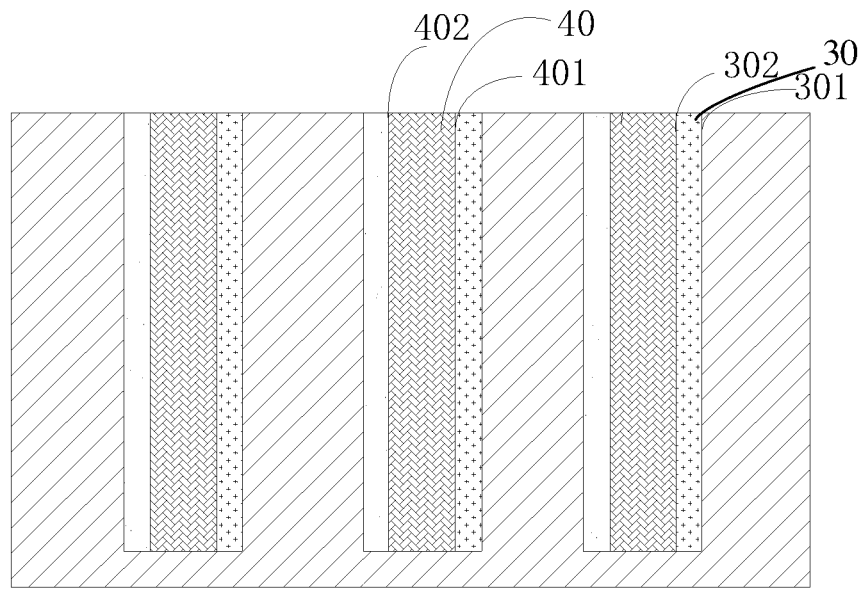
FIG. 7 is a schematic structural diagram obtained after a top electrode structure is formed on a dielectric layer in a method of manufacturing a capacitor according to an exemplary embodiment.

As shown in FIG. 6 and FIG. 7, FIG. 6 is a schematic structural diagram obtained after a dielectric layer 40 is formed on a plurality of bottom electrodes 30 in a method of manufacturing a capacitor according to an exemplary embodiment of the present disclosure. FIG. 7 is a schematic cross-sectional structural diagram obtained after a dielectric layer 40 is formed on a plurality of bottom electrodes 30 in a method of manufacturing a capacitor according to an exemplary embodiment of the present disclosure.

As shown in FIG. 4, FIG. 6, and FIG. 7, the bottom electrode 30 is formed in an opening 20, and the bottom electrode 30 includes a first arc surface 301 and a first plane 302. The first arc surface 301 covers part of the sidewall of the opening 20. The dielectric layer 40 is formed on a remaining part 101 of a filling layer 10 and the plurality of bottom electrodes 30. As shown in FIG. 6, one side 401 of the dielectric layer 40 is in contact with the first planes 302 of the plurality of bottom electrodes 30. The dielectric layer 40 runs through the plurality of openings 20 and the remaining part 101 of the filling layer 10, such that the side 401 of the dielectric layer 40 is in contact with the first planes 302 of the plurality of bottom electrodes 30. A thickness of the dielectric layer 40 may be specified according to a functional requirement of the capacitor. The first arc surfaces 301 of the plurality of bottom electrodes 30 separately cover part of sidewalls of the plurality of openings 20, and the side 401 of the dielectric layer 40 is in contact with the first planes 302 of the plurality of bottom electrodes 30.

A first trench 701 running through the plurality of openings 20 may be formed on the remaining part 101 of the filling layer 10, and a depth of the trench is the same as depths of the plurality of openings 20. The dielectric layer 40 is deposed in the first trench 701 and first planes 302 of the plurality of bottom electrodes 30 by using an ALD process or a CVD process. The side 401 of the dielectric layer 40 is in contact with the first planes 302 of the plurality of bottom electrodes 30.

A material of the dielectric layer 40 may be a material obtained by mixing a plurality of materials, such that the dielectric layer 40 includes at least one dielectric material, where a material with a high dielectric constant (High K) may be selected as the dielectric material. For example, a material with a dielectric constant ranging from 6 to 30 may be selected. The material in this range not only can ensure a high storage density of capacitors due to the high dielectric constant, but also can be adapted to a process for filling, to avoid a case in which filling cannot be performed because the dielectric constant is excessively high and cannot be adapted to a depth-to-width ratio of the opening 20. Further, for example, the dielectric constant may range from 6 to 20, and a specific material may be, for example, listed from a combination of one or more of materials such as silicon nitride ($Si_3N_4$), aluminum oxide ($Al_2O_3$), yttrium oxide ($Y_2O_3$), lanthanum oxide ($La_2O_3$), hafnium oxide (HfO), and zirconium dioxide (NbO).

The first trench 701 may be provided according to any manner, for example, may be provided along the opening group 201. Referring to FIG. 6, it can be learned that the first trench 701 is provided between openings in each opening group 201.

Step S150: Form a top electrode structure on the dielectric layer, where the other side of the dielectric layer is in contact with the top electrode structure.

As shown in FIG. 7 to FIG. 10, FIG. 7 to FIG. 10 is a schematic structural diagram obtained after a top electrode structure 50 is formed on a dielectric layer 40 in a method of manufacturing a capacitor according to an exemplary embodiment of the present disclosure.

Referring to FIG. 7 to FIG. 10, first arc surfaces 301 of a plurality of bottom electrodes 30 separately cover part of sidewalls of a plurality of openings 20, and one side 401 of the dielectric layer 40 is in contact with first planes 302 of the plurality of bottom electrodes 30. The top electrode structure 50 is formed on the other side 402 of the dielectric layer 40. The other side 402 of the dielectric layer 40 is in contact with the top electrode structure 50. The plurality of bottom electrodes 30 and the top electrode structure 50 are separately provided on two sides of the dielectric layer 40, such that the capacitor may not be affected by a thickness of the dielectric layer 40 when needing to satisfy a miniaturization requirement, thereby significantly increasing a capacitor miniaturization limit.

Step S160: Form a gap filling layer by using a final remaining part of the filling layer, to fill remaining gaps between the plurality of bottom electrodes.

Still referring to FIG. 7 to FIG. 10, the final remaining part of the filling layer forms the gap filling layer 102, where the gap filling layer 102 fills remaining gaps between the plurality of bottom electrodes 30.

In this exemplary embodiment of the present disclosure, a patterned mask layer with a plurality of opening patterns is formed on a filling layer 10, and etching is performed in the filling layer 10 by using the patterned mask layer as a mask, until a preset height is reached, to form the plurality of openings 20 in the filling layer 10. The bottom electrode 30 is separately formed in each of the plurality of openings 20, the first trench 701 running through the plurality of openings 20 is formed in the remaining part 101 of the filling layer 10, and the dielectric layer 40 is deposited in the first trench 701 and first planes 302 of the plurality of bottom electrodes 30, where the side 401 of the dielectric layer 40 is in contact with the plurality of bottom electrodes 30. A top electrode structure 50 is formed on the dielectric layer 40, where the other side 402 of the dielectric layer 40 is in contact with the top electrode structure 50. After the plurality of bottom electrodes 30, the dielectric layer 40, and the top electrode structure 50 are formed, the gap filling layer 102 is formed by using the final remaining filling layer, where the gap filling layer 102 fills remaining gaps between the plurality of bottom electrodes 30. The gap filling layer

102 isolates two adjacent bottom electrodes 30, to avoid current leakage or short circuit between the two adjacent bottom electrodes 30.

In the method of manufacturing a capacitor provided in this exemplary embodiment of the present disclosure, the top electrode structure 50 is formed on one side of each of the plurality of bottom electrodes 30, and the plurality of bottom electrodes 30 and the top electrode structure 50 are formed on the two sides of the dielectric layer 40, such that size adjustment of the plurality of bottom electrodes 30 and the top electrode structure 50 is not affected by a thickness required by the dielectric layer 40 when a miniaturization requirement is satisfied in a manufacturing process of the capacitor, provided that a sufficient gap is retained between the plurality of bottom electrodes 30 and the top electrode structure 50, to ensure a sufficient thickness of the dielectric layer 40, thereby significantly increasing a density of capacitors per unit volume.

Figure 8:
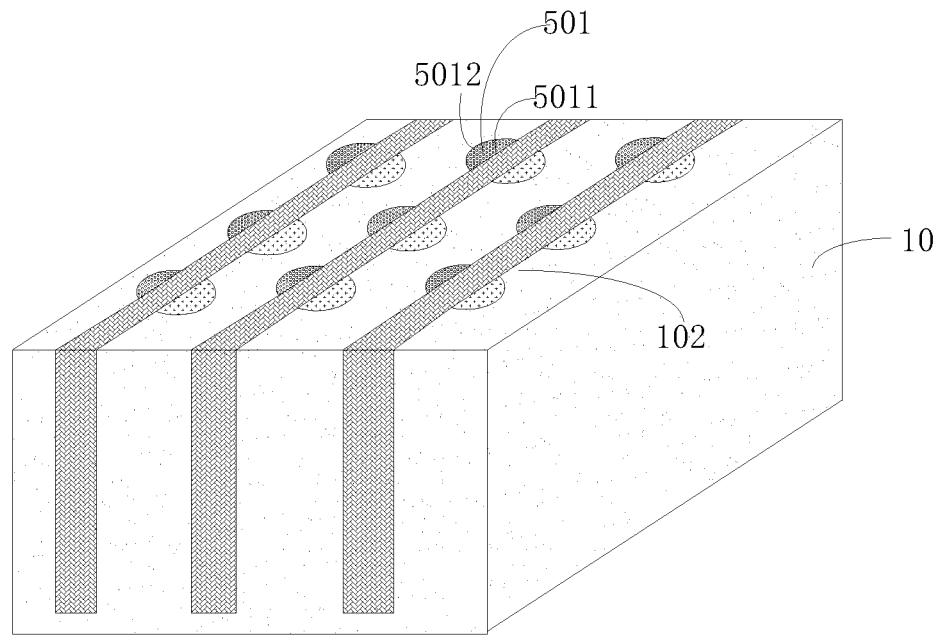
FIG. 8 is a schematic structural diagram obtained after a top electrode structure is formed on a dielectric layer in a method of manufacturing a capacitor according to an exemplary embodiment.

In a method of manufacturing a capacitor provided in an exemplary embodiment of the present disclosure, as shown in FIG. 7 and FIG. 8, the top electrode structure 50 includes a plurality of first top electrodes 501. The process of forming the top electrode structure 50 on the dielectric layer 40 includes:

forming the plurality of first top electrodes 501 on the other side 402 of the dielectric layer 40, where the gap filling layer 102 exists between the plurality of first top electrodes 501.

Still referring to FIG. 8, the bottom electrode 30 is separately formed in each of the plurality of openings 20. The side 401 of the dielectric layer 40 is in contact with the first planes 302 of the plurality of bottom electrodes 30. The plurality of first top electrodes 501 are formed on the other side 402 of the dielectric layer 40. The first top electrode 501 is separately formed in each of the plurality of openings 20, where each first top electrode 501 includes a second plane 5011 and a second arc surface 5012. The other side 402 of the dielectric layer 40 is in contact with the second planes 5011 of the plurality of first top electrodes 501. The second arc surfaces 5012 of the plurality of first top electrodes 501 separately cover the other part of the sidewalls of the openings 20. The plurality of first top electrodes 501 may be made of any electrode material, and the material thereof may be the same as or different from a material of the plurality of bottom electrodes 30.

Still referring to FIG. 7 and FIG. 8, the gap filling layer 102 exists between the plurality of first top electrodes 501. The gap filling layer 102 fills remaining gaps between the plurality of first top electrodes 501. The gap filling layer 102 isolates two adjacent first top electrodes 501, to avoid current leakage or short circuit between the plurality of first top electrodes 501.

In an exemplary embodiment of the present disclosure, the plurality of first top electrodes 501 and the plurality of bottom electrodes 30 may be symmetrically provided on the two sides of the dielectric layer 40, as shown in FIG. 7 and FIG. 8, or may be provided on the two sides of the dielectric layer 40 in another manner, which is not limited in the present disclosure.

In the method of manufacturing a capacitor provided in this exemplary embodiment of the present disclosure, the first top electrode 501 is separately provided in each of the plurality of openings 20, to ensure that the plurality of first top electrodes 501 and the plurality of bottom electrodes 30 are separately provided on the two sides of the dielectric layer 40, such that size adjustment of the plurality of bottom electrodes 30 and the top electrode structure 50 is not affected by the dielectric layer 40 when the capacitor is adapted to a miniaturization requirement, thereby increasing a density of capacitors per unit volume.

In a method of manufacturing a capacitor provided in an exemplary embodiment of the present disclosure, a plurality of first top electrodes 501 and a plurality of bottom electrodes 30 may be simultaneously formed on two sides of a dielectric layer 40, to enable the two to be provided on the two sides of the dielectric layer 40, for example, symmetrically provided on two sides of the dielectric layer 40. That the plurality of first top electrodes 501 and the plurality of bottom electrodes 30 are simultaneously formed on the two sides of the dielectric layer 40 can ensure uniformity and stability of performance between the plurality of first top electrodes 501 and the plurality of bottom electrodes 30.

Figure 11:
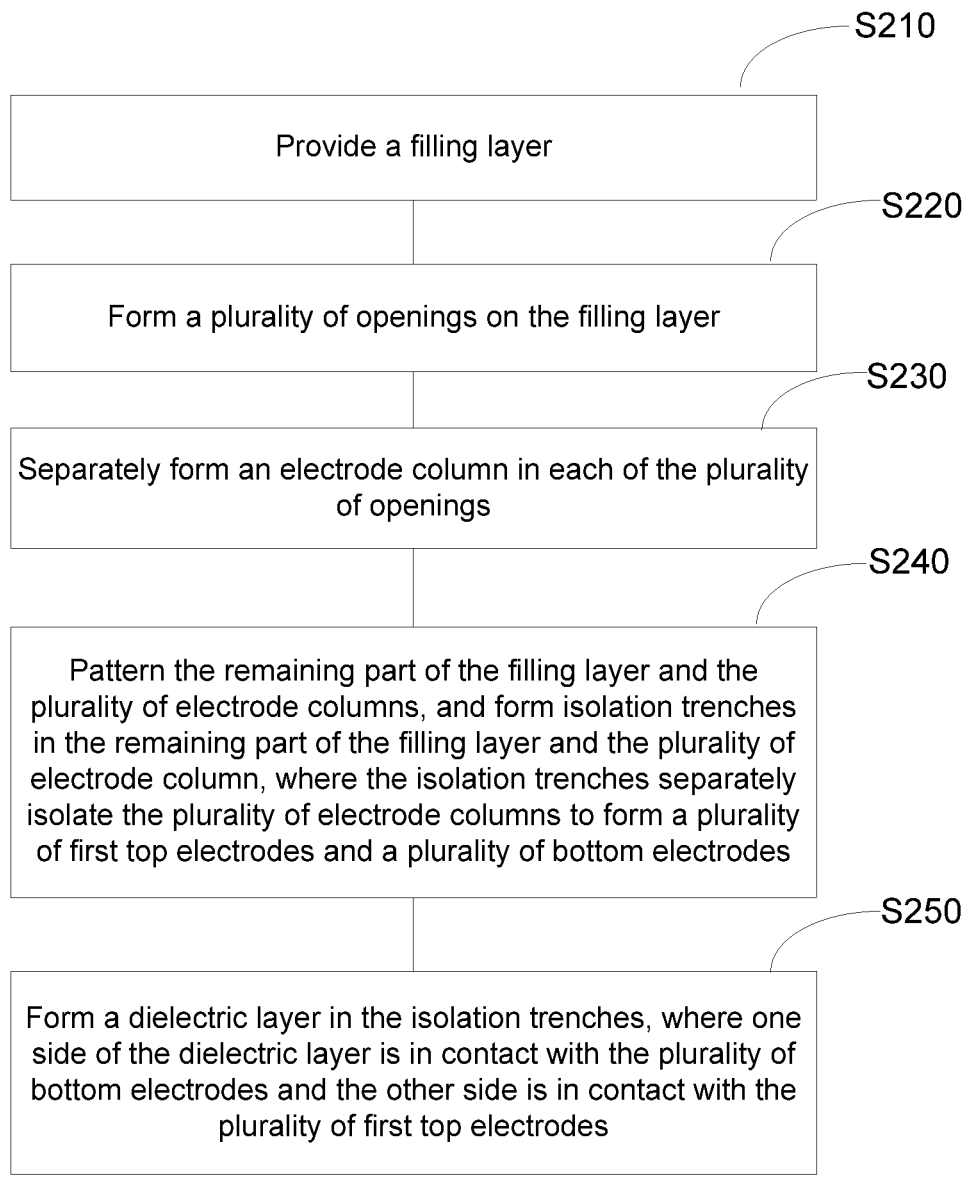
FIG. 11 is a method flowchart of a method of manufacturing a semiconductor structure according to an exemplary embodiment.

As shown in FIG. 11, FIG. 11 is a method flowchart of a method of manufacturing a capacitor according to an exemplary embodiment of the present disclosure, including:

Step S210: Provide a filling layer.

Step S220: Form a plurality of openings on the filling layer.

Steps S210 and S220 of this embodiment are implemented in the same manner as steps S110 and S120 of the foregoing embodiment, and will not be described in detail again herein.

Step S230: Separately form an electrode column in each of the plurality of openings.

Figure 12:
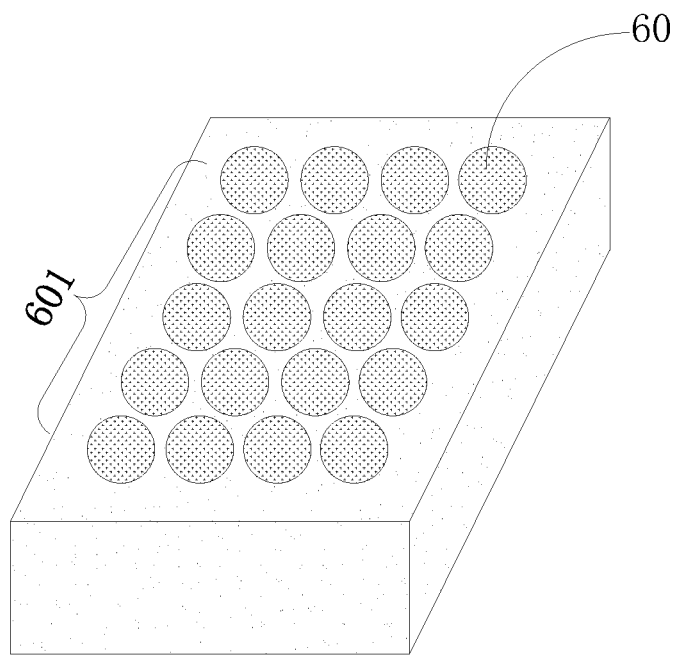
FIG. 12 is a schematic structural diagram obtained after an electrode column is formed in each of a plurality of openings according to an exemplary embodiment.
Figure 13:
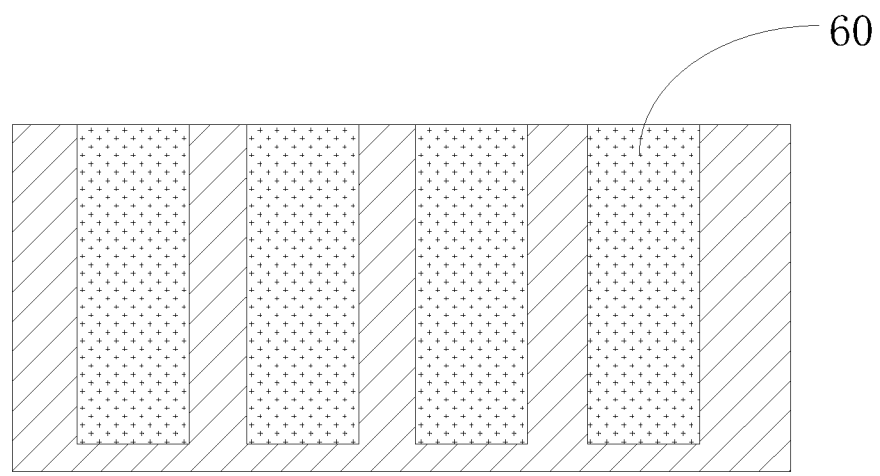
FIG. 13 is a schematic cross-sectional structural diagram obtained after an electrode column is formed in each of a plurality of openings according to an exemplary embodiment.

Referring to FIG. 12 and FIG. 13, FIG. 12 is a schematic structural diagram obtained after an electrode column 60 is separately formed in each of a plurality of openings 20 in a method of manufacturing a capacitor according to an exemplary embodiment of the present disclosure. FIG. 13 is a schematic cross-sectional structural diagram obtained after an electrode column 60 is separately formed in each of a plurality of openings 20 in a method of manufacturing a capacitor according to an exemplary embodiment of the present disclosure.

An electrode material is deposited in the plurality of openings 20, to form the plurality of electrode columns 60. The plurality of openings 20 may be arranged in an array, and the plurality of electrode columns 60 are correspondingly arranged in an array as the plurality of openings 20 are arranged in an array. For example, as shown in FIG. 12, some electrode columns 60 of the plurality of electrode columns 60 are evenly arranged to from an electrode column group 601 along a first direction. A plurality of groups of electrode columns 60 are parallel to each other in groups along a second direction. The first direction is perpendicular to the second direction. The plurality of electrode columns 60 may be alternatively randomly arranged. Upper surfaces of the plurality of electrode columns 60 may be flush with an upper surface of the filling layer 10. A material of the electrode column 60 may be any electrode material, for example, may include but is not limited to, selected titanium nitride, molybdenum nitride, tungsten nitride, tantalum nitride, aluminum nitride, ruthenium nitride, or an alloy thereof, or selected indium tin oxide, tin oxide, or indium zinc oxide, and selected aluminum, tantalum, chromium, copper, gold, platinum, or ruthenium.

Step S240: Pattern the remaining part of the filling layer and the plurality of electrode columns, and form isolation trenches 70 in the remaining part of the filling layer 10 and the plurality of electrode columns 60, where the isolation trenches 70 separately isolate the plurality of electrode columns 60 to form a plurality of first top electrodes 501 and a plurality of bottom electrodes 30.

Figure 14:
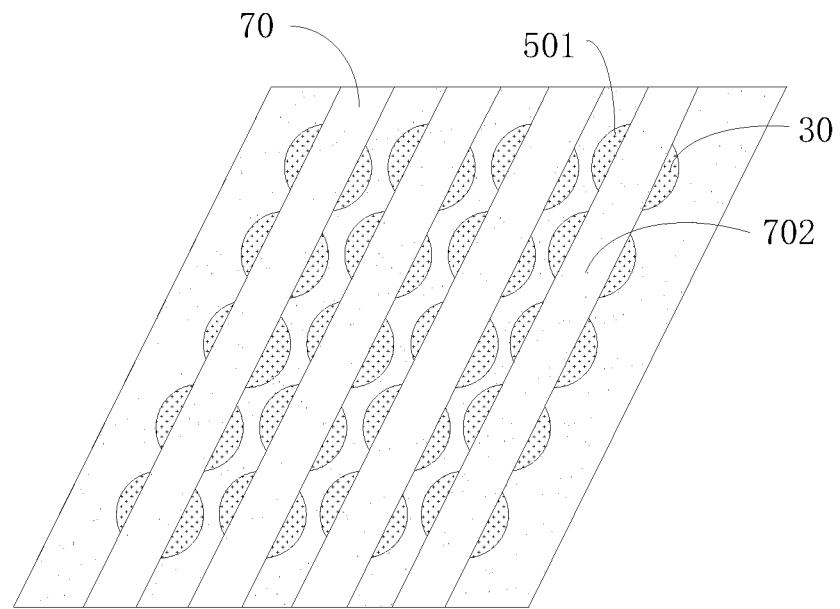
FIG. 14 is a schematic structural diagram obtained after a plurality of isolation trenches are formed in a method of manufacturing a capacitor according to an exemplary embodiment.
Figure 15:
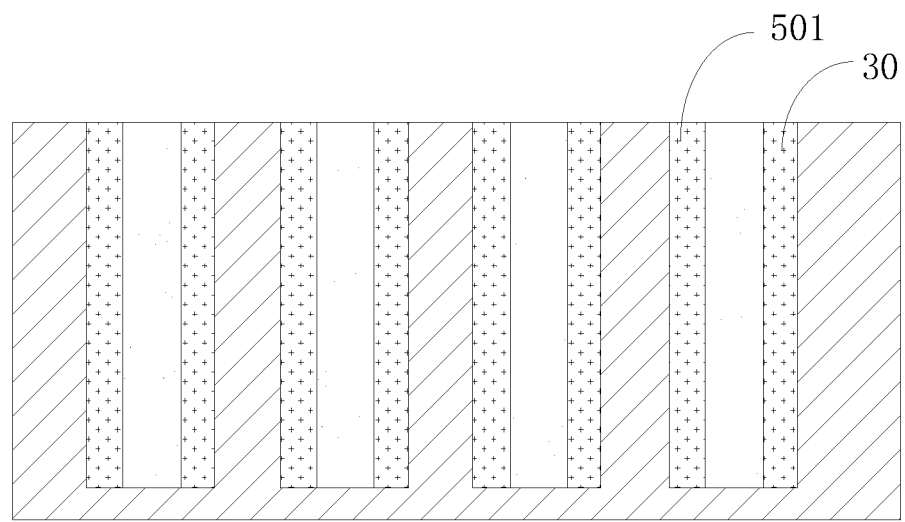
FIG. 15 is a schematic cross-sectional structural diagram obtained after a plurality of isolation trenches are formed in a method of manufacturing a capacitor according to an exemplary embodiment.

As shown in FIG. 14 and FIG. 15, FIG. 14 is a schematic structural diagram obtained after a plurality of isolation trenches 70 are formed in a method of manufacturing a capacitor according to an exemplary embodiment of the present disclosure. FIG. 15 is a schematic cross-sectional structural diagram obtained after a plurality of isolation trenches 70 are formed in a method of manufacturing a capacitor according to an exemplary embodiment of the present disclosure.

An electrode column 60 is formed in each of a plurality of openings 20. A second mask layer may be formed on a surface formed by upper surfaces of the plurality of electrode columns 60 and an upper surface of the remaining part 101 of a filling layer 10, where the second mask layer is provided with a plurality of second opening patterns, and the plurality of second opening patterns are arranged in a preset direction. The plurality of electrode columns 60 and the remaining part 101 of the filling layer 10 are etched down by using the second mask layer as a mask along the plurality of second opening patterns, where the etching is not stopped until the plurality of electrode columns 60 are run through. The plurality of isolation trenches 70 are formed in the plurality of electrode columns 60 and the remaining part 101 of the filling layer 10. The isolation trench 70 includes a first trench 701 located on the remaining part 101 of the filling layer 10 and a second trench 702 running through the plurality of electrode columns 60. The second trench 702 separately isolates the plurality of electrode columns 60 to form a plurality of first top electrodes 501 and a plurality of bottom electrodes 30. The preset direction and a first direction form a preset angle, that is, the preset direction and the first direction have a preset included angle. The preset included angle is specified according to an actual need. For example, if the first top electrode 501 and the bottom electrode 30 in each electrode column 60 need to be symmetrically provided, the preset included angle may be specified to 0 degrees. If the first top electrode 501 and the bottom electrode 30 in each electrode column 60 need to be asymmetrically provided, an angle of the preset included angle may be provided according to a need. A pattern of the isolation trench 70 may be determined according to a need, that is, the second opening pattern may be determined according to a need. For example, side edges on opposite sides of the second opening may be straight. A sidewall of the isolation trench 70 is a plane.

Step S250: Form a dielectric layer 40 in the isolation trenches, where one side of the dielectric layer 40 is in contact with the plurality of bottom electrodes 30 and the other side is in contact with the plurality of first top electrodes 501.

Figure 16:
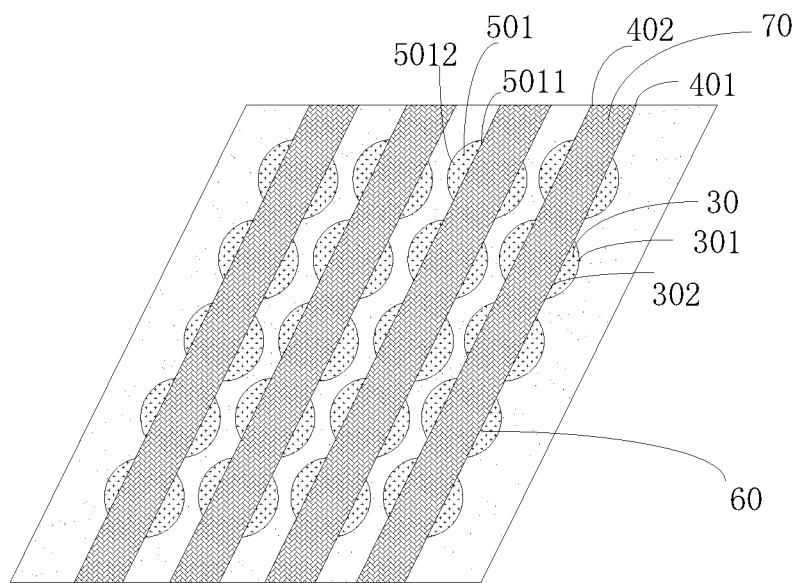
FIG. 16 is a schematic structural diagram obtained after a dielectric layer is formed in isolation trenches in a method of manufacturing a capacitor according to an exemplary embodiment.
Figure 17:
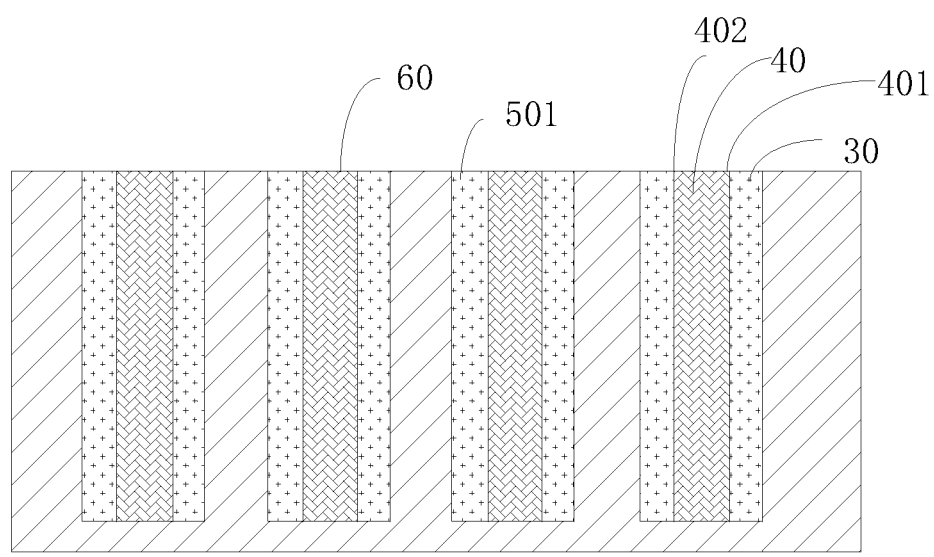
FIG. 17 is a schematic cross-sectional structural diagram obtained after a dielectric layer is formed in isolation trenches in a method of manufacturing a capacitor according to an exemplary embodiment.

As shown in FIG. 16 and FIG. 17, FIG. 16 is a schematic structural diagram obtained after a dielectric layer 40 is formed in isolation trenches 70 in a method of manufacturing a capacitor according to an exemplary embodiment of the present disclosure. FIG. 17 is a schematic cross-sectional structural diagram obtained after a dielectric layer 40 is formed in isolation trenches 70 in a method of manufacturing a capacitor according to an exemplary embodiment of the present disclosure.

A plurality of isolation trenches 70 are formed in the plurality of electrode columns 60 and the remaining part 101 of the filling layer 10. The dielectric layer 40 is deposited in the plurality of isolation trenches 70, and the dielectric layer 40 may be deposited in the isolation trenches 70 by using an ALD process or a CVD process. The dielectric layer 40 includes at least one dielectric material, where a material with a high dielectric constant (High K) may be selected as the dielectric material. For example, a material with a dielectric constant ranging from 6 to 30 may be selected. The material with a high dielectric constant may adopt a combination of one or more of materials such as $Si_3N_4$, $Al_2O_3$, $Y_2O_3$, $La_2O_3$, HfO, and NbO.

The dielectric layer 40 is formed in the isolation trenches 70, where one side 401 of the dielectric layer 40 is in contact with the plurality of bottom electrodes 30 and the other side 402 of the dielectric layer 40 is in contact with the plurality of first top electrodes 501. As shown in FIG. 16 and FIG. 17, the plurality of bottom electrodes 30 and the plurality of first top electrodes 501 are formed in the openings 20 and are separately provided on two sides of the dielectric layer 40. Each bottom electrode 30 includes a first arc surface 301 and a first plane 302. The first arc surface 301 covers part of the sidewall of the opening 20. The side 401 of the dielectric layer 40 is in contact with the first planes 302 of the plurality of bottom electrodes 30. Each first top electrode 501 includes a second plane 5011 and a second arc surface 5012. The second arc surfaces 5012 of the plurality of first top electrodes 501 separately cover the other part of the sidewalls of the openings 20, and the other side 402 of the dielectric layer 40 is in contact with the second planes 5011 of the plurality of first top electrodes 501. The isolation trench 70 runs through a plurality of electrode columns 60, to enable the dielectric layer 40 to run through the plurality of electrode columns 60, such that the plurality of bottom electrodes 30 and the plurality of first top electrodes 501 separately provided on two sides of the dielectric layer 40 are isolated, thereby avoiding short circuit between the plurality of bottom electrodes 30 and the plurality of first top electrodes 501.

The side 401 of the dielectric layer 40 is in contact with the first planes 302 of the plurality of bottom electrodes 30 and the other side 402 is in contact with the second planes 5011 of the plurality of first top electrodes. Sidewalls of the side 401 and the other side 402 of the dielectric layer 40 are planes, to ensure that the plurality of bottom electrodes 30 and the plurality of first top electrodes 501 are separately provided on the two sides of the dielectric layer 40. An upper surface of the dielectric layer 40 may be flush with upper surfaces of the plurality of bottom electrodes 30 and upper surfaces of the plurality of first top electrodes 501 and be flush with an upper surface of the filling layer 10.

In the method of manufacturing a capacitor provided in this exemplary embodiment of the present disclosure, the plurality of first top electrodes 501 and the plurality of bottom electrodes 30 are simultaneously formed on the two sides of the dielectric layer 40, such that uniformity and stability of performance between the plurality of first top electrodes 501 and the plurality of bottom electrodes 30 are ensured; and the plurality of first top electrodes 501 and the plurality of bottom electrodes 30 are separately provided on the two sides of the dielectric layer 40 by using the dielectric layer 40 running through the plurality of electrode columns 60, such that short circuit between the plurality of bottom electrodes 30 and the plurality of first top electrodes 501 is avoided.

Figure 20:
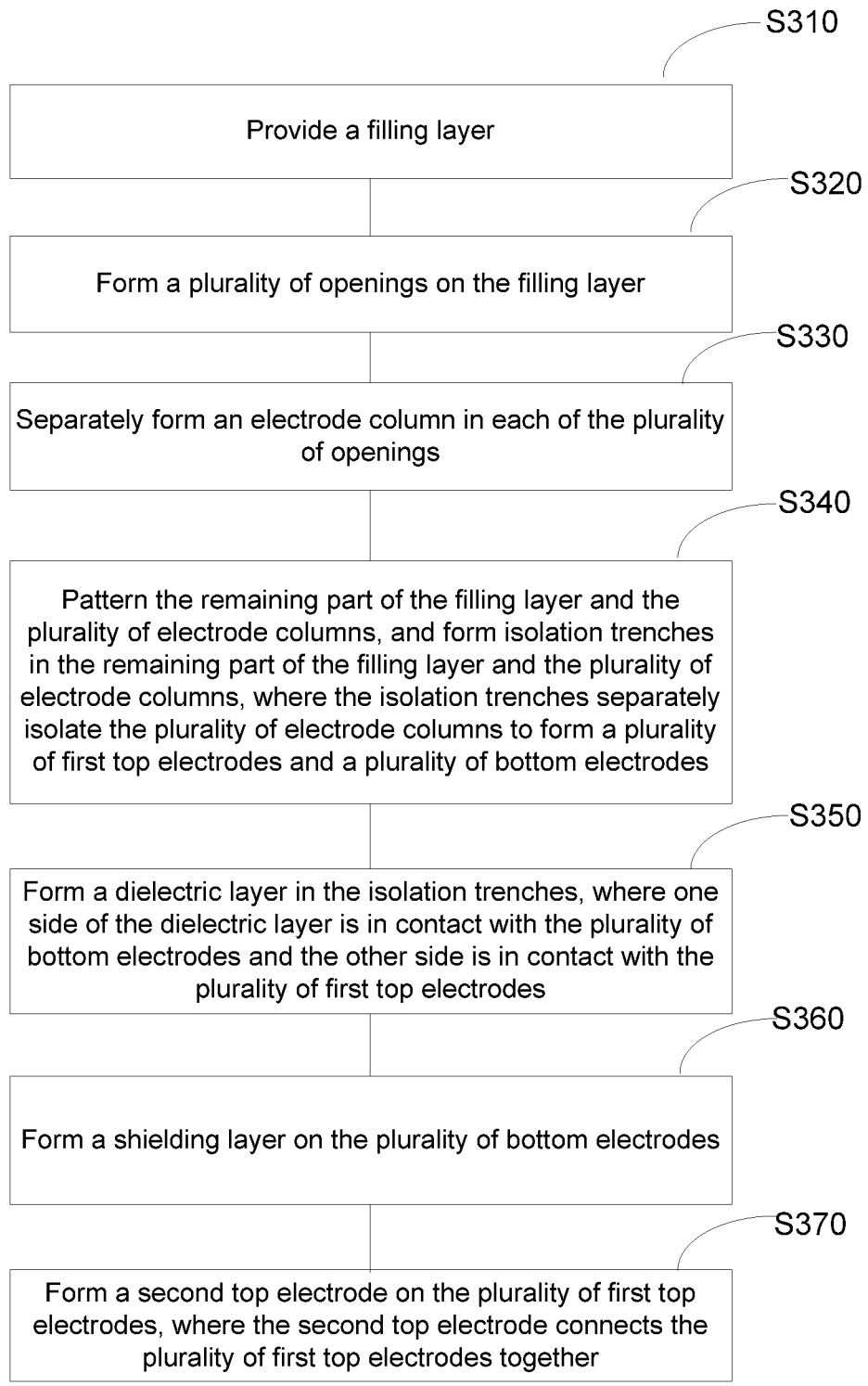
FIG. 20 is a method flowchart of forming a top electrode structure on a dielectric layer according to an exemplary embodiment.

In a method of manufacturing a capacitor provided in an exemplary embodiment of the present disclosure, a top electrode structure 50 further includes a second top electrode 502. FIG. 20 shows a process of forming a top electrode structure on a dielectric layer according to an exemplary embodiment of the present disclosure, including the following steps.

Step S310: Provide a filling layer.

Step S320: Form a plurality of openings on the filling layer.

Step S330: Separately form an electrode column in each of the plurality of openings.

Step S340: Pattern the remaining part of the filling layer and the plurality of electrode columns, and form isolation trenches in the remaining part of the filling layer and the plurality of electrode columns, where the isolation trenches separately isolate the plurality of electrode columns to form a plurality of first top electrodes and a plurality of bottom electrodes.

Step S350: Form a dielectric layer in the isolation trenches, where one side of the dielectric layer is in contact with the plurality of bottom electrodes and the other side is in contact with the plurality of first top electrodes.

Steps S310 to S350 of this embodiment are implemented in the same manner as steps S210 to S250 of the foregoing embodiment, and will not be described in detail again herein.

Step S360: Form a shielding layer 80 on the plurality of bottom electrodes.

Step S370: Form a second top electrode on the plurality of first top electrodes, where the second top electrode connects the plurality of first top electrodes together.

Figure 9:
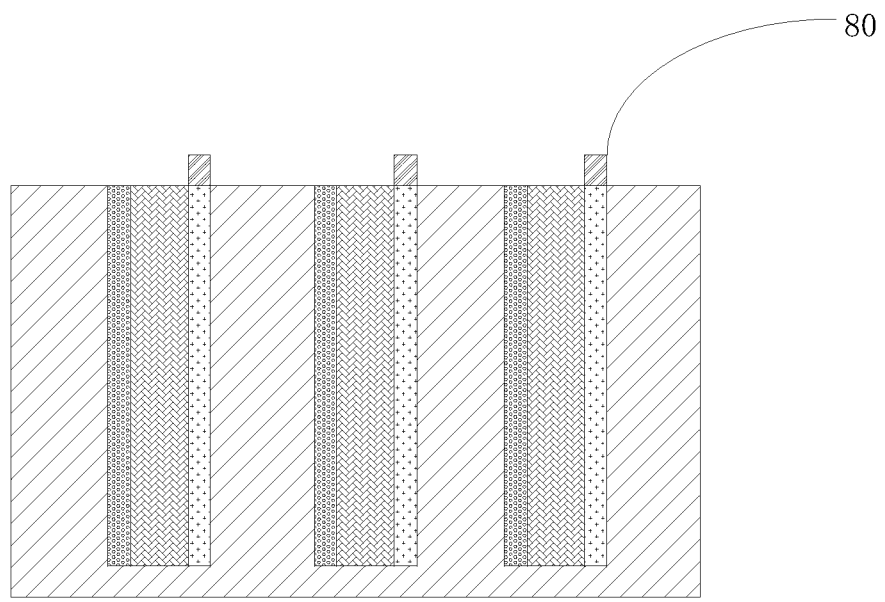
FIG. 9 is a schematic structural diagram obtained after a top electrode structure is formed on a dielectric layer in a method of manufacturing a capacitor according to an exemplary embodiment.
Figure 10:
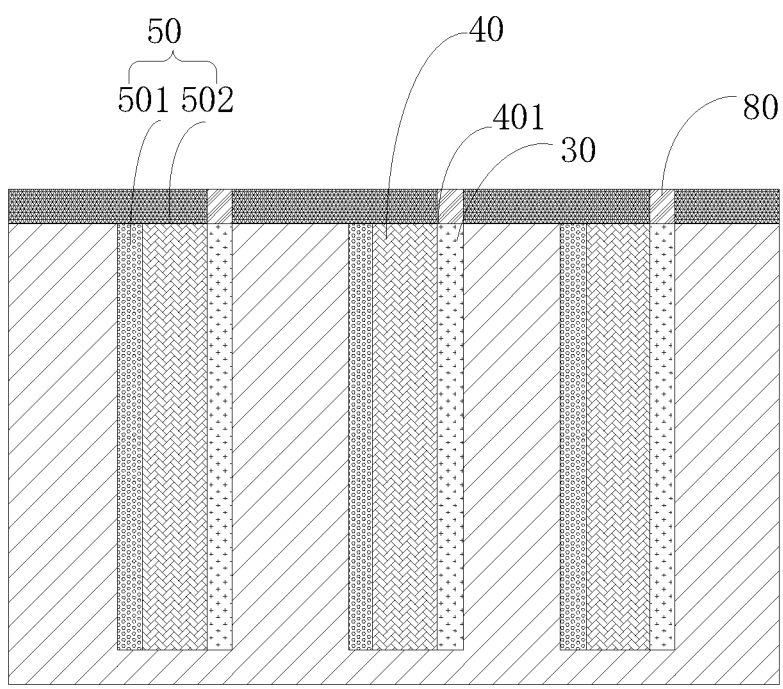
FIG. 10 is a schematic structural diagram obtained after a top electrode structure is formed on a dielectric layer in a method of manufacturing a capacitor according to an exemplary embodiment.
Figure 18:
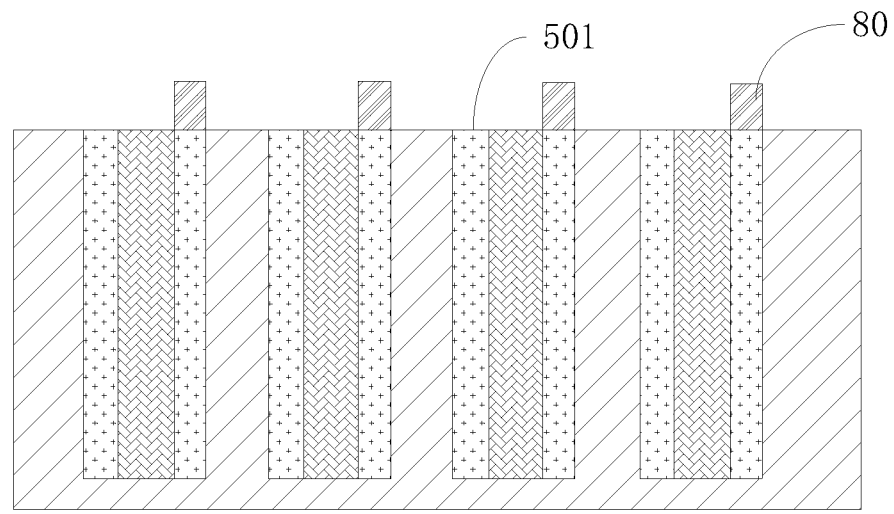
FIG. 18 is a schematic cross-sectional structural diagram obtained after a shielding layer is formed in a method of manufacturing a capacitor according to an exemplary embodiment.
Figure 19:
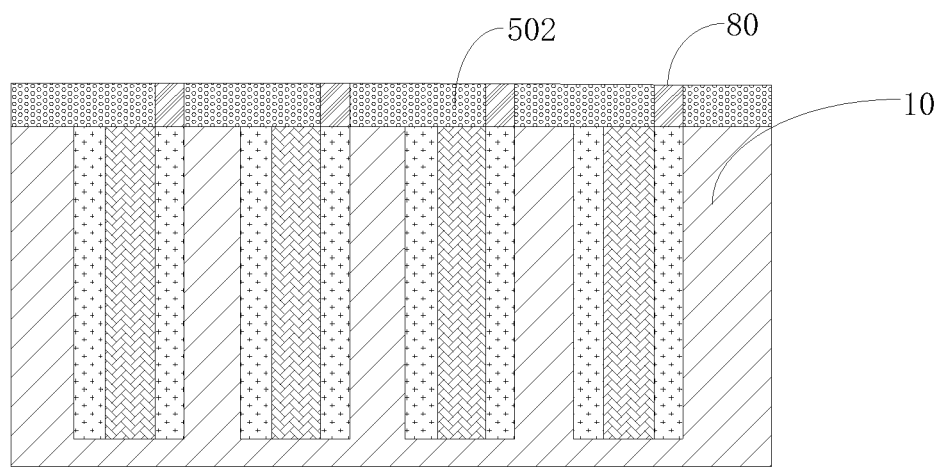
FIG. 19 is a schematic cross-sectional structural diagram obtained after a second top electrode is formed in a method of manufacturing a capacitor according to an exemplary embodiment.

Still referring to FIG. 9 and FIG. 10 and referring to FIG. 18 and FIG. 19, the dielectric layer 40 is formed in the isolation trenches, where one side 401 of the dielectric layer is in contact with the plurality of bottom electrodes 30 and the other side 402 is in contact with the plurality of first top electrodes 501. An upper surface of the dielectric layer 40 may be flush with upper surfaces of the plurality of bottom electrodes 30 and upper surfaces of the plurality of first top electrodes 501 and be flush with an upper surface of the filling layer 10.

The second top electrode 502 is formed on the plurality of first top electrodes 501, where the second top electrode 502 connects the plurality of first top electrodes 501 together, and the second top electrode 502 is a shared top electrode layer, for example, includes but is not limited to, germanium silicon, such that the plurality of first top electrodes 501 are connected to, for example, a metal layer (not shown), by using the shared top electrode layer and a target layer.

To avoid short circuit between the top electrode and the bottom electrode, the second top electrode 502 cannot be in contact with the plurality of bottom electrodes 30. Therefore, before the forming a second top electrode 502 on the plurality of first top electrodes 501, the method may further include: forming the shielding layer 80 on the plurality of bottom electrodes.

To avoid a case in which the second top electrode 502 is connected to the plurality of bottom electrodes 30 in the process of forming the second top electrode 502, the shielding layer 80 is formed on the plurality of bottom electrodes 30 before the second top electrode 502 is formed. An initial shielding layer may be formed on a surface formed by an upper surface of the dielectric layer 40, upper surfaces of the plurality of bottom electrodes 30, upper surfaces of the plurality of first top electrodes 501, and an upper surface of the filling layer 10, and a third mask layer is formed on the initial shielding layer, where the third mask layer is provided with a plurality of third opening patterns. Projection of a region of the third mask layer except for the plurality of third opening patterns on the filling layer 10 covers the plurality of bottom electrodes 30. Etching is performed down along the plurality of third opening patterns by using the third mask layer as a mask, to remove an exposed initial shielding layer, where the remaining part of the initial shielding layer forms the shielding layer 80, and the shielding layer 80 shields the plurality of bottom electrodes 30. Still referring to FIG. 9 and FIG. 10 and referring to FIG. 18 and FIG. 19, the shielding layer 80 shields the plurality of bottom electrodes 30. The shielding layer may be made of a photoresist material.

After the shielding layer 80 is formed, a material of the second top electrode is deposited on the upper surface of the dielectric layer 40, the upper surfaces of the plurality of bottom electrodes 30, an upper surface and a side surface of the shielding layer 80, and the upper surface of the filling layer 10, to form the initial second top electrode layer 502. A thickness of the second top electrode layer 502 may be the same as or different from a thickness of the shielding layer 80. When the thickness of the second top electrode layer 502 is the same as the thickness of the shielding layer 80, the material of the second top electrode covering the upper surface of the shielding layer 80 is removed. When the thickness of the second top electrode layer 502 is different from the thickness of the shielding layer 80, the material of the second top electrode covering the upper surface and part of the side surface of the shielding layer 80 is removed, such that a region except for the shielding layer 80 covers the material of the second top electrode, to form the second top electrode layer 502. The shielding layer 80 covers a plurality of bottom electrodes 30, such that the second top electrode layer 502 can be effectively isolated from the plurality of bottom electrodes 30, thereby avoiding short circuit between the second top electrode layer 502 and the plurality of bottom electrodes 30.

Figure 21:
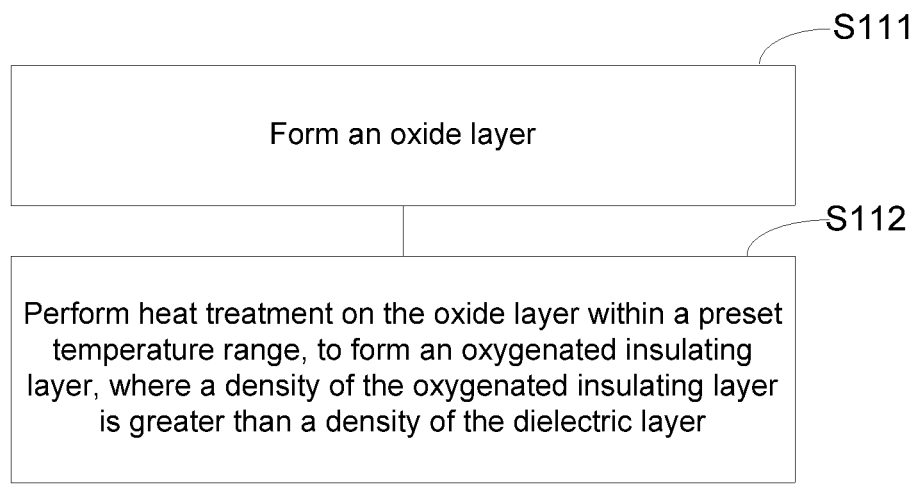
FIG. 21 is a method flowchart of a process of forming a filling layer according to an exemplary embodiment.

In a method of manufacturing a capacitor provided in an exemplary embodiment of the present disclosure, a filling layer 10 includes an oxygenated insulating layer. FIG. 21 shows a process of providing a filling layer according to an exemplary embodiment of the present disclosure, including the following steps.

Step S111: Form an oxide layer.

Step S112: Perform heat treatment on the oxide layer within a preset temperature range, to form an oxygenated insulating layer, where a density of the oxygenated insulating layer is greater than a density of the dielectric layer.

In this embodiment, the filling layer may include an oxygenated insulating layer 11, and oxide of the oxygenated insulating layer may include but is not limited to silicon oxide and silicon oxynitride. That the filling layer includes the oxygenated insulating layer 11 can avoid current leakage and short circuit between top and bottom electrodes of the capacitor. To improve insulating performance of the filling layer, after the oxide layer 12 is formed, the heat treatment is performed on the oxide layer 12 within the preset temperature range, which is, for example, from 1100° C. to 2300° C., for example, 1300° C. or 1800° C., to form an oxygenated insulating layer 11 with a high density, where the density of the oxygenated insulating layer is greater than the density of the dielectric layer. The density of the oxygenated insulating layer 11 is greater than the density of the dielectric layer 40, to further improve insulation between the plurality of bottom electrodes 30 or the plurality of first top electrodes 501, thereby providing more possibilities for increasing a density of capacitors per unit volume.

An exemplary embodiment of the present disclosure provides a capacitor. Referring to FIG. 10 and FIG. 19, it can be learned that the capacitor includes: a plurality of bottom electrodes 30; a top electrode structure 50 formed on one side of each of the plurality of bottom electrodes 30; a dielectric layer 40, where one side 401 of the dielectric layer 40 is in contact with the plurality of bottom electrodes 30 and the other side 402 of is in contact with the top electrode structure 50; and a gap filling layer 102 filling remaining gaps between the plurality of bottom electrodes. That the gap filling layer 102 fills gaps between the plurality of bottom electrodes 30 can avoid current leakage or short circuit between the plurality of bottom electrodes 30.

In the capacitor provided in an exemplary embodiment of the present disclosure, the top electrode structure 50 is formed on one side of each of the plurality of bottom electrodes 30, and the plurality of bottom electrodes 30 and the top electrode structure 50 are formed on two sides of the dielectric layer 40, such that size adjustment of the plurality of bottom electrodes 30 and the top electrode structure 50 is not affected by a thickness required by the dielectric layer 40, provided that a sufficient gap is retained between the plurality of bottom electrodes 30 and the top electrode structure 50, to ensure a sufficient thickness of the dielectric layer 40, thereby significantly increasing a density of capacitors per unit volume.

Referring to FIG. 6 and FIG. 14, the plurality of bottom electrodes 30 may be arranged in an array. For example, the plurality of bottom electrodes 30 are evenly arranged to form bottom electrode groups 301 along a first direction. The plurality of bottom electrode groups 301 are parallel to each other along a second direction. The first direction is perpendicular to the second direction. The plurality of bottom electrodes 30 may be alternatively randomly arranged. The bottom electrode includes a first plane and a first arc surface, where the first plane is in contact with the dielectric layer and the first arc surface is in contact with the gap filling layer. As shown in FIG. 5 and FIG. 6, one side 401 of the dielectric layer 40 is in contact with the first planes 302 of the plurality of bottom electrodes 30. The first arc surfaces 301 of the plurality of bottom electrodes 30 separately cover part of sidewalls of the plurality of openings 20, and the side 401 of the dielectric layer 40 is in contact with the first planes 302 of the plurality of bottom electrodes 30.

Still referring to FIG. 10 and FIG. 19, it can be learned that the top electrode structure 50 may include a plurality of first top electrodes 501, where the plurality of first top electrodes 501 is in contact with the dielectric layer 40, and a gap filling layer 102 fills gaps between the plurality of first top electrodes 501. That the gap filling layer 102 fills gaps between the plurality of first top electrodes 501 can avoid current leakage or short circuit between the plurality of first top electrodes 501.

One side 401 of the dielectric layer 40 is in contact with the plurality of bottom electrodes 30 and the other side 402 is in contact with the plurality of first top electrodes 501, such that the plurality of first top electrodes 501 and the plurality of bottom electrodes 30 are provided on two sides of the dielectric layer 40. Sidewalls on the two sides of the dielectric layer 40 are planes, to enable the plurality of first top electrodes 501 and the plurality of bottom electrodes 30 to be separately provided on the two sides of the dielectric layer 40, and the plurality of first top electrodes 501 to be provided on one side of each of the plurality of bottom electrodes 30, such that size adjustment of the plurality of bottom electrodes 30 and the top electrode structure 50 is not affected by the dielectric layer 40 when the capacitor is adapted to a miniaturization requirement, thereby increasing a density of capacitors per unit volume. A material of the dielectric layer 40 may include a metal oxide material with a high dielectric constant. For example, the dielectric layer 40 is made of a metal oxide material with a dielectric constant ranging from 6 to 30. To improve insulation between the plurality of bottom electrodes 30 or the plurality of first top electrodes 501, the gap filling layer 102 may be made of an oxygenated insulating material whose density is greater than a density of the dielectric layer 40.

The top electrode structure may further include a second top electrode 502, where the second top electrode 502 is in contact with the plurality of first top electrodes 501 to connect the plurality of first top electrodes 501 together. The second top electrode 502 is formed on the plurality of first top electrodes 501, where the second top electrode 502 connects the plurality of first top electrodes 501 together, and the second top electrode 502 is a shared top electrode layer, such that the plurality of first top electrodes 501 are connected to, for example, a metal layer (not shown), by using the shared top electrode layer and a target layer.

Figure 22:
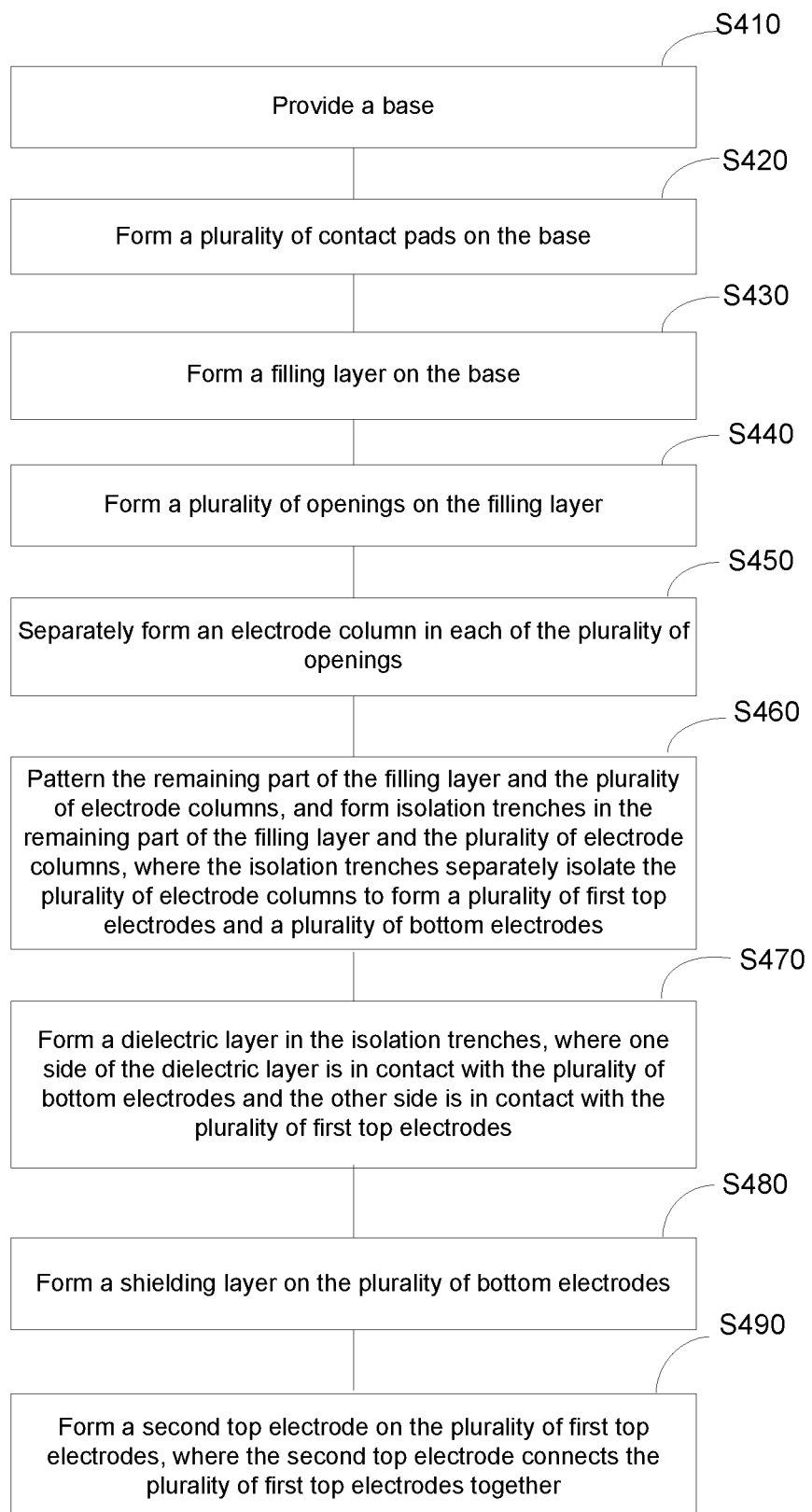
FIG. 22 is a method flowchart of a method of manufacturing a semiconductor device according to an exemplary embodiment.
Figure 23:
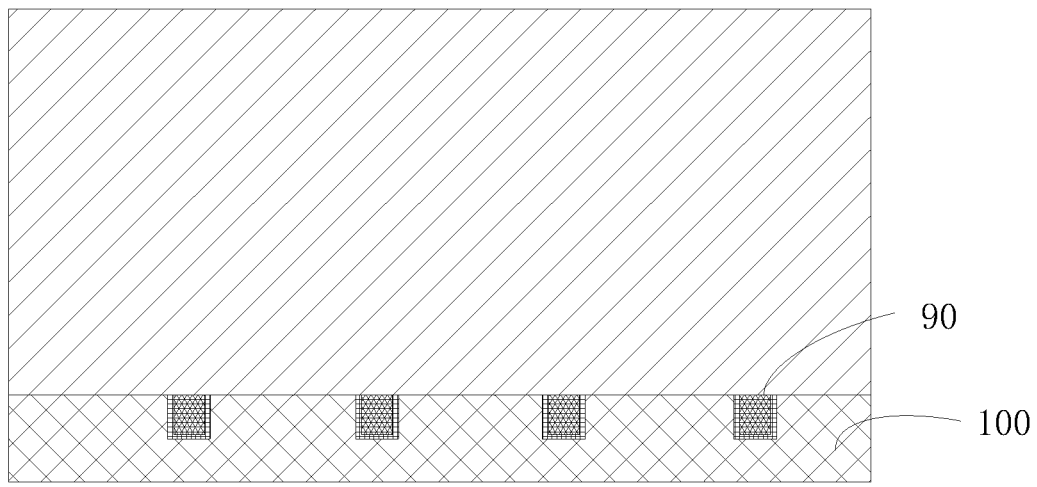
FIG. 23 is a schematic structural diagram of a semiconductor device according to an exemplary embodiment.

An exemplary embodiment of the present disclosure provides a method of manufacturing a semiconductor device 1000. In this exemplary embodiment of the present disclosure, an example in which a plurality of first top electrodes 501 and a plurality of bottom electrodes 30 are simultaneously formed on two sides of a dielectric layer 40, to enable the two to be provided on the two sides of the dielectric layer 40 is used for description. As shown in FIG. 22, FIG. 22 is a flowchart of a method of manufacturing a semiconductor device 1000 according to an exemplary embodiment of the present disclosure.

Step S410: Provide a base.

Referring to FIG. 23 to FIG. 27, FIG. 23 to FIG. 27 are each a schematic structural diagram of a semiconductor device 1000 according to an exemplary embodiment of the present disclosure.

The base 100 may be made of a semiconductor material. The semiconductor material may be one or more of silicon, germanium, a silicon-germanium compound, and a silicon-carbon compound. For example, the base 100 may be a silicon-on-insulator (SOI) base or a germanium-on-insulator (GOI) base. In another embodiment, alternatively, the base 100 may be made of an insulating material such as silicon oxide or silicon nitride.

Step S420: Form a plurality of contact pads on the base.

Still referring to FIG. 23 to FIG. 27, a plurality of contact pads 90 are formed on the base 100, where positions of the plurality of contact pads are provided to correspond to positions of the plurality of bottom electrodes 30.

Step S430: Form a filling layer on the base.

The filling layer 10 may include an oxygenated insulating layer 11. The filling layer may be formed in a manner shown by the schematic flowchart of FIG. 21. A density of the oxygenated insulating layer 11 is greater than a density of the dielectric layer 40, to improve insulation between the plurality of bottom electrodes 30 or a plurality of first top electrodes 501.

Step S440: Form a plurality of openings 20 on the filling layer.

Figure 24:
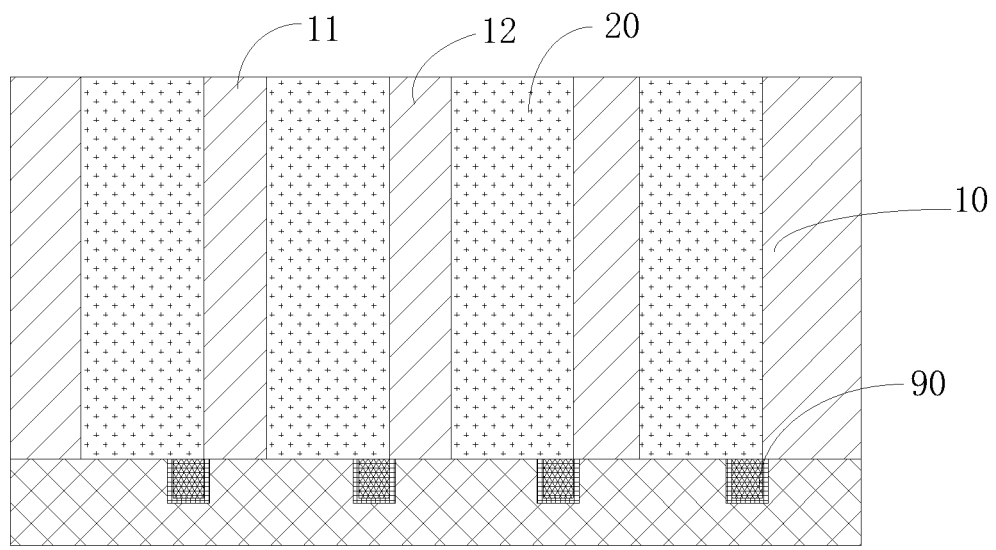
FIG. 24 is a schematic structural diagram of a semiconductor device according to an exemplary embodiment.

In this embodiment, as shown in FIG. 24, the plurality of openings 20 run through the filling layer 10, to expose part of the base 100 and the plurality of contact pads 90. A step of forming the openings 20 and an arrangement manner of the openings 20 are the same as those in the other embodiments, and details are not described herein again.

Step S450: Separately form an electrode column 60 in each of the plurality of openings 20.

In this embodiment, the implementation of this step is the same as that of step S230, and details are not described herein again.

Step S460: Pattern the remaining part of the filling layer and the plurality of electrode columns 60, and form isolation trenches 70 in the remaining part of the filling layer and the plurality of electrode columns 60, where the isolation trenches 70 separately isolate the plurality of electrode columns 60 to form a plurality of first top electrodes 501 and a plurality of bottom electrodes 30.

Figure 25:
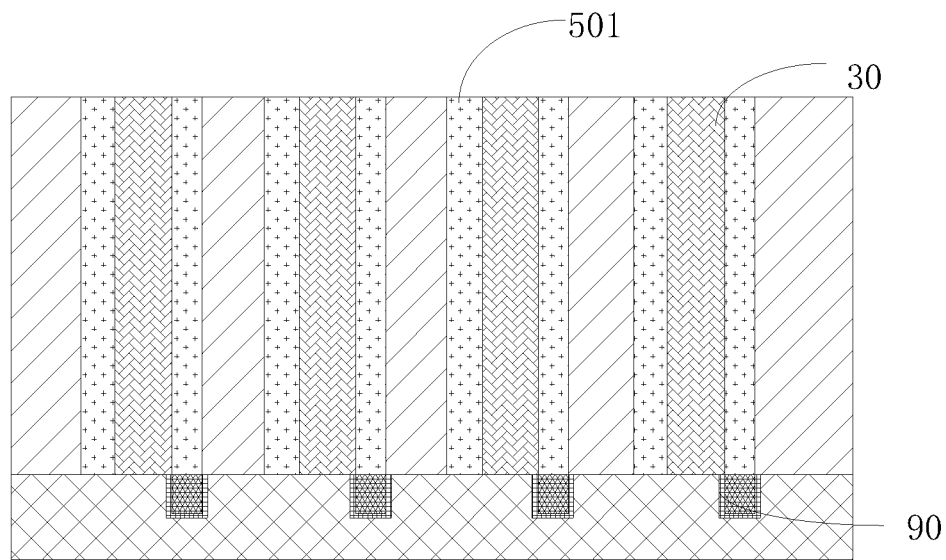
FIG. 25 is a schematic structural diagram of a semiconductor device according to an exemplary embodiment.
Figure 26:
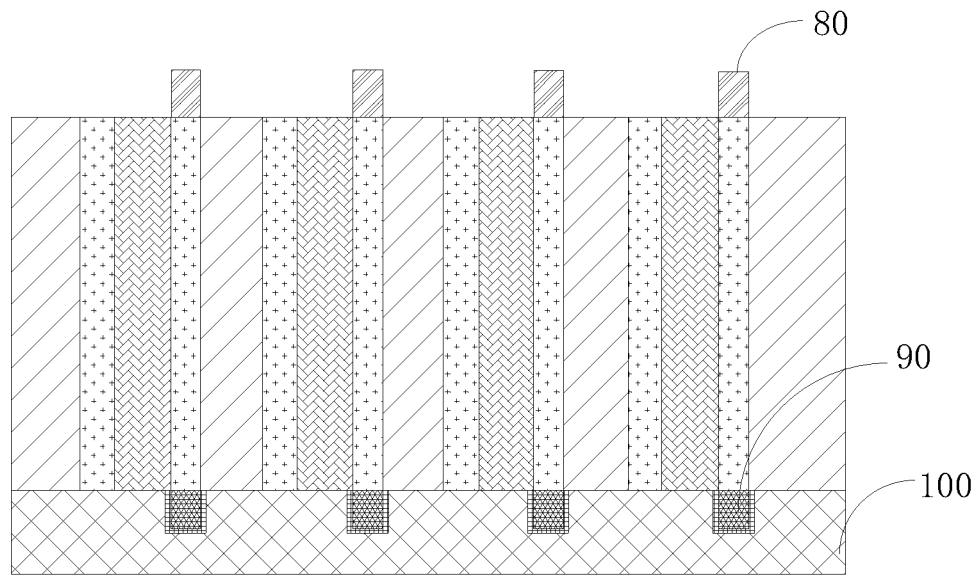
FIG. 26 is a schematic structural diagram of a semiconductor device according to an exemplary embodiment.

In this embodiment, the implementation of this step is the same as that of step S240, and details are not described herein again. A difference lies in that, as shown in FIG. 25, in this step, the plurality of bottom electrodes 30 are separately located on the plurality of contact pads 90.

Step S470: Form a dielectric layer 40 in the isolation trenches 70, where one side 401 of the dielectric layer 40 is in contact with the plurality of bottom electrodes 30 and the other side 402 is in contact with the plurality of first top electrodes 501.

Step S480: Form a shielding layer on the plurality of bottom electrodes 30.

Step S490: Form a second top electrode 502 on the plurality of first top electrodes 501, where the second top electrode 502 connects the plurality of first top electrodes 501 together.

Steps S470 to S490 of this embodiment are implemented in the same manner as steps S350 to S370 of the foregoing embodiment, and will not be described in detail again herein.

Figure 27:
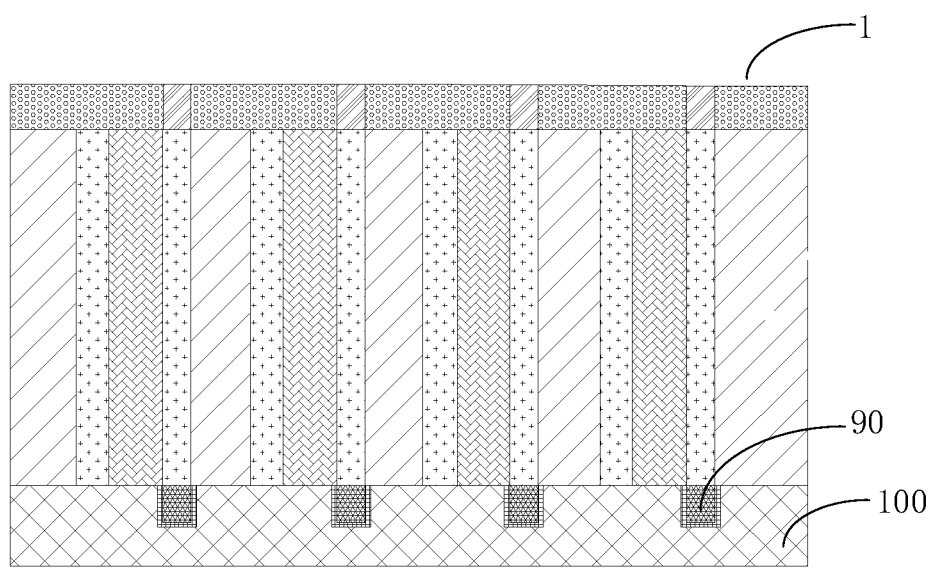
FIG. 27 is a schematic structural diagram of a semiconductor device according to an exemplary embodiment.

For a semiconductor device manufactured by using the method of manufacturing a semiconductor device provided in this exemplary embodiment of the present disclosure, as shown in FIG. 27, the semiconductor device 1000 includes a base 100, a plurality of contact pads 90 formed on the base 100, and a capacitor 1, where a plurality of bottom electrodes of the capacitor 1 are separately located on the plurality of contact pads 90.

In the semiconductor device provided in this exemplary embodiment of the present disclosure, the semiconductor device 1000 includes the base 100, the plurality of contact pads 90 formed on the base 100, and the capacitor 1 provided in the present disclosure, where the plurality of bottom electrodes 30 of the capacitor 1 are separately located on the plurality of contact pads 90, a top electrode structure 50 is formed on one side of each of the plurality of bottom electrodes 30, and the plurality of bottom electrodes 30 and the top electrode structure 50 are formed on two sides of the dielectric layer 40, such that size adjustment of the plurality of bottom electrodes 30 and the top electrode structure 50 is not affected by a thickness required by the dielectric layer 40, provided that a sufficient gap is retained between the plurality of bottom electrodes 30 and the top electrode structure 50, to ensure a sufficient thickness of the dielectric layer 40, thereby significantly increasing a density of capacitors per unit volume.

According to the capacitor, the method of manufacturing a capacitor, and the semiconductor device that are provided in the embodiments of the present disclosure, size adjustment of the capacitor is not limited by a manufacturing process, such that a density of capacitors per unit volume is increased.

The embodiments or implementations of this specification are described in a progressive manner, and each embodiment focuses on differences from other embodiments. The same or similar parts between the embodiments may refer to each other.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The invention claimed is:

1. A method of manufacturing a capacitor, comprising:
   providing a filling layer;
   forming a plurality of openings on the filling layer;
   separately forming a bottom electrode in each of the plurality of openings;
   forming a dielectric layer on a remaining part of the filling layer and the plurality of bottom electrodes, wherein one side of the dielectric layer is in contact with the plurality of bottom electrodes and along the thickness direction of the filling layer, the length of each of the plurality of bottom electrodes is the same as that of the dielectric layer;
   forming a top electrode structure on the dielectric layer, wherein the other side of the dielectric layer is in contact with the top electrode structure; and
   forming a gap filling layer by using a final remaining part of the filling layer, to fill remaining gaps between the plurality of bottom electrodes.

2. The method according to claim 1, wherein the forming a top electrode structure on the dielectric layer comprises:
   forming a plurality of first top electrodes on the other side of the dielectric layer, wherein the gap filling layer exists between the plurality of first top electrodes.

3. The method according to claim 2, wherein the plurality of first top electrodes and the plurality of bottom electrodes are simultaneously formed on two sides of the dielectric layer, to enable the two to be provided on the two sides of the dielectric layer.

4. The method according to claim 3, wherein simultaneously forming the plurality of first top electrodes and the plurality of bottom electrodes comprises:
   separately forming an electrode column in each of the plurality of openings;
   patterning the remaining part of the filling layer and plurality of electrode columns, and forming isolation trenches in the remaining part of the filling layer and the plurality of electrode columns, wherein the isolation trenches separately isolate the plurality of electrode columns to form the plurality of first top electrodes and the plurality of bottom electrodes; and
   forming the dielectric layer in the isolation trenches, wherein one side of the dielectric layer is in contact with the plurality of bottom electrodes and the other side is in contact with the plurality of first top electrodes.

5. The method according to claim 2, wherein the forming a top electrode structure on the dielectric layer further comprises:
   forming a second top electrode on the plurality of first top electrodes, wherein the second top electrode connects the plurality of first top electrodes together.

6. The method according to claim 1, wherein the filling layer comprises an oxygenated insulating layer; and the providing a filling layer comprises:
   forming an oxide layer; and
   performing heat treatment on the oxide layer within a preset temperature range to form the oxygenated insulating layer, wherein a density of the oxygenated insulating layer is greater than a density of the dielectric layer.

\* \* \* \* \*